(12) United States Patent
Takahashi et al.

(10) Patent No.: US 6,241,461 B1
(45) Date of Patent: Jun. 5, 2001

(54) APPARATUS FOR TRANSPORTING PARTS

(75) Inventors: Shigeki Takahashi; Nihei Kaishita; Akira Nemoto, all of Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/307,730

(22) Filed: May 10, 1999

(30) Foreign Application Priority Data

May 15, 1998 (JP) .................................................. 10-133064

(51) Int. Cl.[7] ............................ B65G 25/04; H05K 13/02
(52) U.S. Cl. ...................................... 414/798.9; 198/750.1
(58) Field of Search .................. 29/740, 759; 198/468.9, 198/750.1; 414/798.9

(56) References Cited

U.S. PATENT DOCUMENTS

| | | |
|---|---|---|
| 3,699,985 | 10/1972 | Faust . |
| 4,162,724 * | 7/1979 | Shinjo ................................. 198/534 |
| 5,503,299 | 4/1996 | Smith ................................. 221/186 |
| 6,135,699 * | 10/2000 | Yutaka et al. ................. 414/798.9 X |
| 6,152,671 * | 11/2000 | Kaishita et al. .............. 198/750.1 X |

FOREIGN PATENT DOCUMENTS

| | | | |
|---|---|---|---|
| 289 958 * | 5/1991 | (DE) ................................. | 414/798.9 |
| 0 683 625 | 11/1995 | (EP) . | |
| 8-48419 | 2/1996 | (JP) . | |
| 1 692 922 * | 11/1991 | (RU) ................................. | 414/798.9 |

OTHER PUBLICATIONS

Patent Abstracts of Japan, vol. 096, No. 006, Jun. 28, 1996, Abstract No. 08–048419.

* cited by examiner

*Primary Examiner*—Janice L. Krizek
(74) *Attorney, Agent, or Firm*—Burns, Doane, Swecker & Mathis, LLP (57) ABSTRACT

A part transporting apparatus comprises: a guiding groove for lining up parts in one row and guiding the parts; a transporting member which is provided at the base of the guiding groove and transports the parts in a forward direction by itself moving forwards and backwards along the groove; and a driving means for reciprocally driving the transporting member in the forward and backward directions; wherein the transporting member is advanced slowly and retracted rapidly, so as to transport the parts forwards. Provided to this arrangement are: a second stopper which operates so as to open and close in the width direction of the guiding groove, and hold the second part from the front of the row of parts; and a movable first stopper which stops the first part at the tip of the guiding groove; wherein the first stopper is moved forwards synchronously with the transporting member immediately prior to completion of the forward movement of the transporting member, thereby separating the first part in the row from the second part. The first stopper retreats following the retreat of the transporting member. Such an arrangement provides for an apparatus for transporting parts, wherein the first part and second part can be separated in a sure manner even in the event that the parts are non-magnetic material, wherein ease of extracting of the first part is facilitated, and wherein parts can be supplied in a sure manner even in the event that an extracting failure occurs.

10 Claims, 10 Drawing Sheets

APPARATUS FOR TRANSPORTING PARTS

BACKGROUND OF THE INVENTION

1. Field of the Invention

The present invention relates to an apparatus for transporting parts, and particularly relates to an apparatus for transporting parts which separates the first part in a row of parts being transported from the second part in this row.

2. Description of the Related Art

Regarding apparatuses for transporting small parts such as chip parts, an apparatus is known wherein an endless belt comprises the bottom of a transporting groove through which parts are guided, and wherein the parts are transported by means of intermittent driving of this belt (see Japanese Unexamined Patent Publication No. 8-48419). In the case of this apparatus, a mechanism is provided for separating the first part in the row on the belt from the second part in the row, so as to allow the first part in the row to be extracted therefrom. This separating mechanism acts so that a stopper is brought into contact with the front-most end of a guiding groove at the time that the parts on the belt move forward with the forward motion of the belt, the first part is stopped at a certain position, and upon the first part coming into contact with the stopper so that motion of all parts is stopped, the second part is held in the same position by a holding pin while the stopper is opened forwards so as to allow the first part to proceed forward while remaining in the state of being attached by a permanent magnet on the stopper, thereby forcibly forming a gap between the first part and the second part.

However, this method in the above separating mechanism involves stopping the movement of all parts, attaching the first part by a permanent magnet provided in the stopper, and pulling this part forward by magnetic force, meaning that the parts cannot be separated in the event that the part is formed of a non-magnetic material, or that debris or the like is on the part such that magnetism does not effectively work. Also, friction occurs between the part and belt at the time of extracting the first part, so there is the possibility that the attachment between the permanent magnet and the part may be separated. Thus, such an arrangement has the problem of being unreliable.

Also, even in the event that the first part and second part are separated, the first part on the belt may not be correctly extracted at the time of extracting the part with an suction head such as a mounter or the like. In the event that the equipment fails to extract the part, the stopper cannot return to the original position (i.e., the position at which the stopper comes into contact with the tip of the guiding groove), since subsequent parts are being pressed forward by the belt. Accordingly, the first and second part cannot be separated. Known arrangements necessitate monitoring to check whether or not such failures occur, and in the event that such an extracting failure does occur, the entire apparatus being shut down.

SUMMARY OF THE INVENTION

Accordingly, it is an object of the present invention to provide an apparatus for transporting parts, wherein the first part and second part can be separated in a sure manner even in the event that the parts are non-magnetic material, wherein ease of extracting of the first part is facilitated, and wherein parts can be supplied in a stable manner even in the event that an extracting failure occurs.

In order to achieve the above objects, a first embodiment of the present invention consists of a part transporting apparatus, comprising: a guiding groove for lining up parts in one row and guiding the parts; a transporting member which is provided at the base of the guiding groove and transports parts in one direction by itself moving forwards and backwards along the groove; a driving means for reciprocally driving the transporting member in the forward and backward directions; a first stopper which is provided at the tip of the guiding groove to stop the first part in the row; a second stopper which operates so as to open and close in the width direction of the guiding groove, and hold the second part from the front of the row of parts being transported on the upper plane of the transporting member; a synchronizing means for opening and closing the second stopper synchronously with the reciprocal forward and backward movement of the transporting member; and a synchronizing mechanism for moving the first stopper forwards synchronously with the transporting member immediately before completion of the forward movement of the transporting member, and for moving the first stopper backwards following the backward movement of the transporting member; wherein, once the stopper holds the second part, the transporting member moves forward by a certain distance, thereby separating the first part in the row and the second part.

The first characteristic of the present invention is that the transporting member is reciprocally driven in the forward and backward directions to transport the parts forward, and that once the stopper holds the second part, the transporting member moves further forward, thereby separating the first part and the second part. Accordingly, the driving mechanism is simplified in comparison with known intermittent driving mechanisms using belts, and the first part and second part can be separated in a sure manner even in the event that the part is non-magnetic.

The second characteristic of the present invention is that a first stopper is provided at the tip of the guiding groove to stop the first part in the row, and a synchronizing mechanism is also provided for moving the first stopper forwards synchronously with the transporting member immediately before completion of the forward movement of the transporting member and for moving the first stopper backwards following the backward movement of the transporting member. That is, the first part is abutted against a first stopper at the time of separating the first part and the second part, thereby facilitation ease of extracting. Also, even in the event that an extracting failure leaves the first part remaining on the transporting member, the first part is pressed back by the first stopper to a position at which it is in contact with the second part, so that the separation/extraction can be attempted any number of times. Accordingly, even in the event that an extracting failure occurs, supply can be continued without stopping the overall apparatus.

FIGS. 1A through 1G illustrate an example of the operating principle of the part transporting apparatus according to the present invention. This operating principle corresponds to a certain arrangement of the present invention.

Figure 1A:
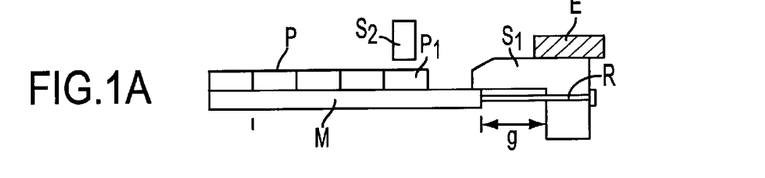
FIGS. 1A through 1G are explanatory diagrams illustrating a first operating principle of the apparatus for transporting parts according to the present invention.

FIG. 1A is the initial position, with both sides of the parts P being guided by a guiding groove (not shown), and thereby arrayed in a single row. A transporting member M capable of moving forwards and backwards is provided to the bottom plane of the guiding groove. The parts P ride on the upper surface of the transporting member M, and an opened second stopper $S_2$ is located by the side of the first part $P_1$. In this drawing, the second stopper $S_2$ is positioned above the parts P, but in actual use is positioned to the side of the parts P (in the direction perpendicular to the surface of the drawing). In front of the transporting member M is the first stopper $S_1$ at a certain distance away. The transporting member M and the first stopper $S_1$ are linked with a certain gap g therebetween by means of a synchronizing member R. Also, the first stopper $S_1$ is held by a certain amount of friction resistance by a resistance member E formed of elastic material.

Figure 1B:
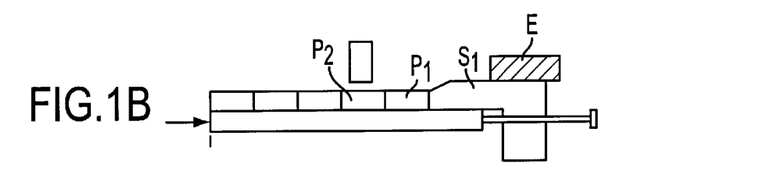

FIG. 1B shows the transporting member M in a state of having been moved forward by one pitch. At this point, the first part $P_1$ comes into contact with the first stopper $S_1$. Here, the first stopper $S_1$ is motionless at the initial position by means of the friction resistance of the resistance member E, and the front of the transporting member M has not yet come into contact with the rear of the first stopper $S_1$.

Figure 1C:
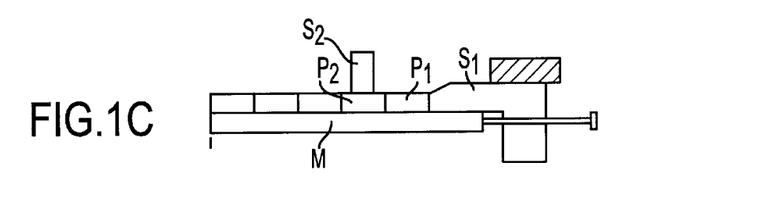

FIG. 1C shows the second stopper $S_2$ being operated in the closing direction, and the second part $S_2$ being pressed against the insides of the guiding groove so as to be held. This disables the second and subsequent parts from advancing.

Figure 1D:
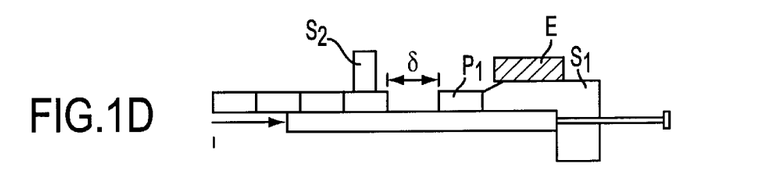

FIG. 1D shows the transporting member M in a state of having been moved further forward. Here, the first part $P_1$ moves forward with the forward movement of the transporting member M while remaining in contact with the first stopper $S_1$, but the second and subsequent parts P are restrained by the second stopper $S_2$, so relative slippage is generated between the transporting member M and the second and subsequent parts P. Consequently, a gap $\delta$ is generated between the first part $P_1$ and second part $P_2$. Incidentally, in the process of progressing from FIG. 1C to FIG. 1D, the front end of the transporting member M comes into contact with the rear of the first stopper $S_1$, and the first stopper $S_1$ is move forwards synchronously with the transporting member M. Accordingly, in the process of progressing from FIG. 1C to FIG. 1D, the amount of movement of the first stopper $S_1$ is not as great as that of the transporting member M.

Figure 1E:
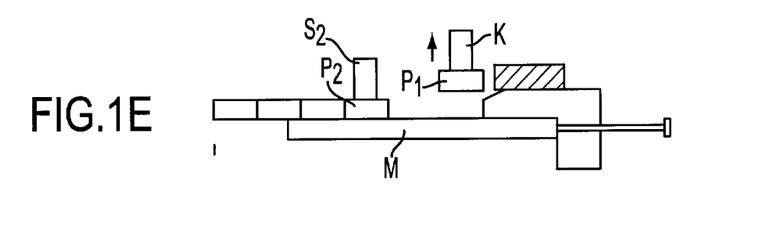

FIG. 1E shows an extracting device K such as a mounter or the like being used to extract the first part $P_1$. At this time, a gap $\delta$ is provided between the first part $P_1$ and second part $P_2$, so there is no danger of the second part $P_2$ being accidentally extracted.

Figure 1F:
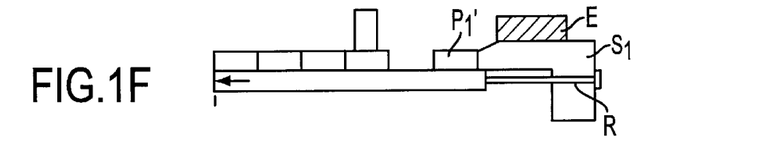

FIG. 1F shows the transporting member M in a state of being moved backwards. At this point, some sort of means is provided to prevent the parts P from moving backwards with the transporting member M. Consequently, relative slippage is generated between the transporting member M and the parts P, so the transporting member M alone moves backward and the parts P are maintained at the progressed position. Incidentally, the first stopper $S_1$ is held by the resistance member E, so the tip position is maintained until the head of the synchronizing member R comes into contact with the first stopper $S_1$, and is retracted trailing the transporting member M.

Figure 1G:
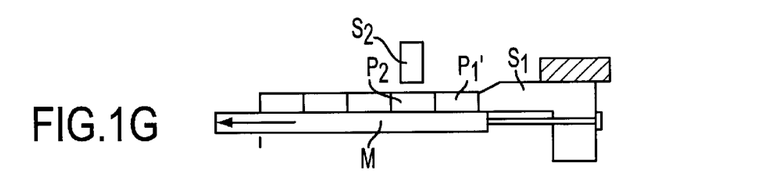

FIG. 1G illustrates the state wherein the transporting member M has returned to its initial position. The initial position of the first stopper $S_1$ is determined by the transporting member M and the synchronizing member R.

Repeating the operation shown in FIGS. 1A through 1G intermittently transports the row of parts P forward, and sequentially extracts the first part $P_1$ one at a time.

The above description has been made regarding a case wherein the extracting device K has succeeded in extracting the first part $P_1$; next, a description will be made regarding a case wherein the extraction of the first part $P_1$ fails.

That is, in an arrangement that the first stopper $S_1$ is a stopper fixed in one position, in the event that the first part $P_1$ remains on the transporting member M as a result of a failure to extract this first part $P_1$, the subsequent second part $P_2$ stays in contact with the rear side of the first part $P_1$, so that the first part $P_1$ and the second part $P_2$ cannot be separated. On the other hand, in an arrangement that the first stopper $S_1$ is movable back and forth, with the amount of movement thereof being smaller than that of the transporting member M, the first part $P_1$, remaining due to the extracting failure can be pressed back to a position of being in contact with the second part $P_2$, as shown in FIGS. 1F and 1G by double-dotted lines. Accordingly, the first part $P_1$ and the second part $P_2$ can be separated by conducting an operation in the order of FIGS. 1G, 1B, 1C, 1D, and 1E. In other words, the part extracting operation can be repeated for however many times necessary. Accordingly, there is no need to constantly monitor for extracting failures, nor is there any need to stop the entire apparatus in the event that such extracting failures occur.

FIGS. 2A through 2G illustrate an example of the operating principle of the part transporting apparatus according to a certain arrangement of the present invention.

Figure 2A:
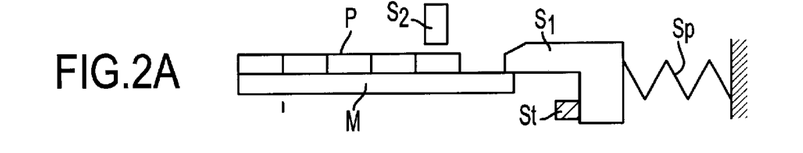
FIGS. 2A through 2G are explanatory diagrams illustrating a second operating principle of the apparatus for transporting parts according to the present invention.

FIG. 2A is the initial position, and in front of the transporting member M is the first stopper $S_1$ at a certain distance away. The first stopper $S_1$ is pressed backwards by a spring Sp, and the backwards movement thereof is restricted by a stopping member St.

Figure 2B:
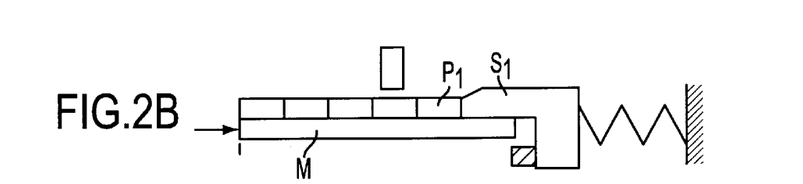

FIG. 2B shows the transporting member M in a state of having been moved forward by one pitch. At this point, the first part $P_1$ comes into contact with the first stopper $S_1$.

Figure 2C:
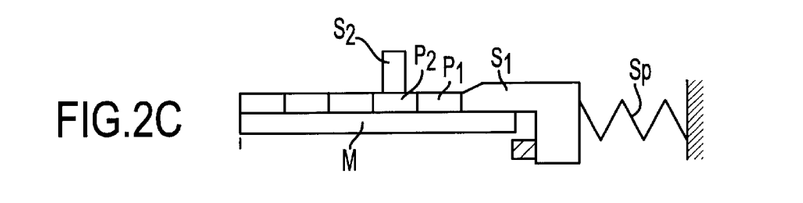

FIG. 2C shows the second stopper $S_2$ being operated in the closing direction, and the second part $S_2$ being pressed against the insides of the guiding groove so as to be held. This disables the second and subsequent parts from advancing.

Figure 2D:
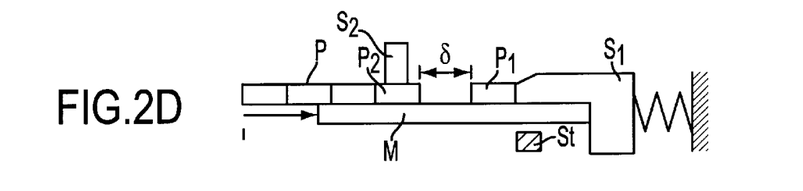

FIG. 2D shows the transporting member M in a state of having been moved further forward by a certain distance. Here, the first part $P_1$ moves forward with the forward movement of the transporting member M while remaining in contact with the first stopper $S_1$, but the second and subsequent parts P are restrained by the second stopper $S_2$, so a gap $\delta$ is generated between the first part $P_1$ and second part $P_2$. Incidentally, in the process of progressing from FIG. 2C to FIG. 2D, the front end of the transporting member M comes into contact with the rear of the first stopper $S_1$, and the first stopper $S_1$ is pressed forwards by the transporting member M. Accordingly, in the process of progressing from FIG. 2C to FIG. 2D, the amount of movement of the first stopper $S_1$ is not as great as that of the transporting member M.

Figure 2E:
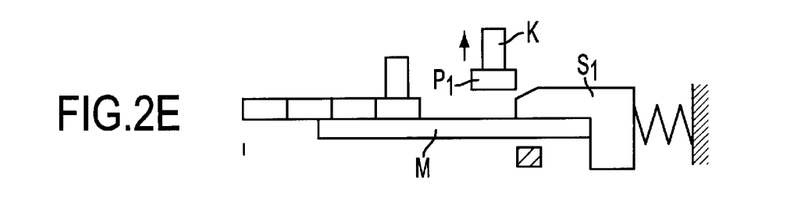

FIG. 2E shows an extracting device K such as a mounter or the like being used to extract the first part $P_1$. At this time, a gap $\delta$ is provided between the first part $P_1$ and second part $P_2$, so there is no danger of the second part $P_2$ being accidentally extracted.

Figure 2F:
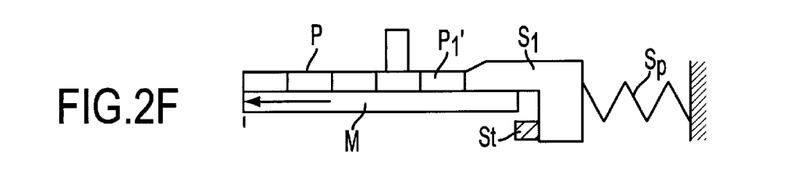
Figure 2G:
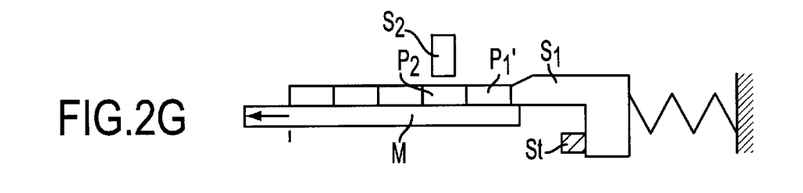

FIG. 2F shows the transporting member M in a state of being moved backwards. At this point, some sort of means is provided to prevent the parts P from moving backwards with the transporting member M. Consequently, relative slippage is generated between the transporting member M and the parts P, so the transporting member M alone moves forward and the parts P are maintained at the progressed position. Incidentally, the first stopper $S_1$ is pressed backwards by the spring Sp, and is retracted following the transporting member M.

FIG. 1G illustrates the state wherein the transporting member M has returned to its initial position. In the process of returning, the first stopper $S_1$ comes into contact with the stopping member St and stops.

As with the case illustrated in FIGS. 1A through 1G, even in the event that extracting of the first part $P_1$ fails, the first part $P_1$ and second part $P_2$ can be separated by the forward movement of the transporting member M.

Though FIGS. 1A through 1G and FIGS. 2A through 2G show examples wherein the first stopper $S_1$ moves forwards and backwards in a straight line with the transporting member M, the first stopper $S_1$ need not be restricted to such which moves in a straight line; rather, it may move in an arc. Also, the synchronizing member R is not restricted to a shaft-like member fixed to the transporting member M; rather, any member may be used which causes the first stopper $S_1$ to follow behind the transporting member M, including using a magnet. Further, a metal spring or the like may be used for the resistance member E, instead of an elastic member such as rubber.

Regarding the method of transporting the parts in one direction with the transporting member, it is preferable that friction is used, according to a fifth aspect of the invention. That is, the driving means may drive the transporting member in a reciprocal manner such that the speed of moving in the backward direction is greater than the speed of moving in the forward direction. The speed of moving in the forward direction is a speed at which holding friction acts between the transporting member and the parts disposed upon the upper surface thereof, and the speed of moving in the backward direction is a speed at which the friction between the transporting member and the parts disposed upon the upper surface thereof is essentially broken. With such an arrangement, the parts can be transported in one direction simply by reciprocal driving of the transporting member, so the transporting mechanism can be simplified, and further, the parts are not restrained, so there is little damage inflicted upon the parts. Incidentally, the term "the friction . . . is essentially broken" includes not only speeds at which friction does not act at all, but also speeds at which the parts do not actually move backwards even if friction does act.

DETAILED DESCRIPTION OF THE PREFERRED EMBODIMENTS

FIGS. 3 through 8 illustrate an example of the apparatus for transporting parts, according to the present invention. Incidentally, chip-type electronic parts are used as the parts P in this embodiment.

Figure 3:
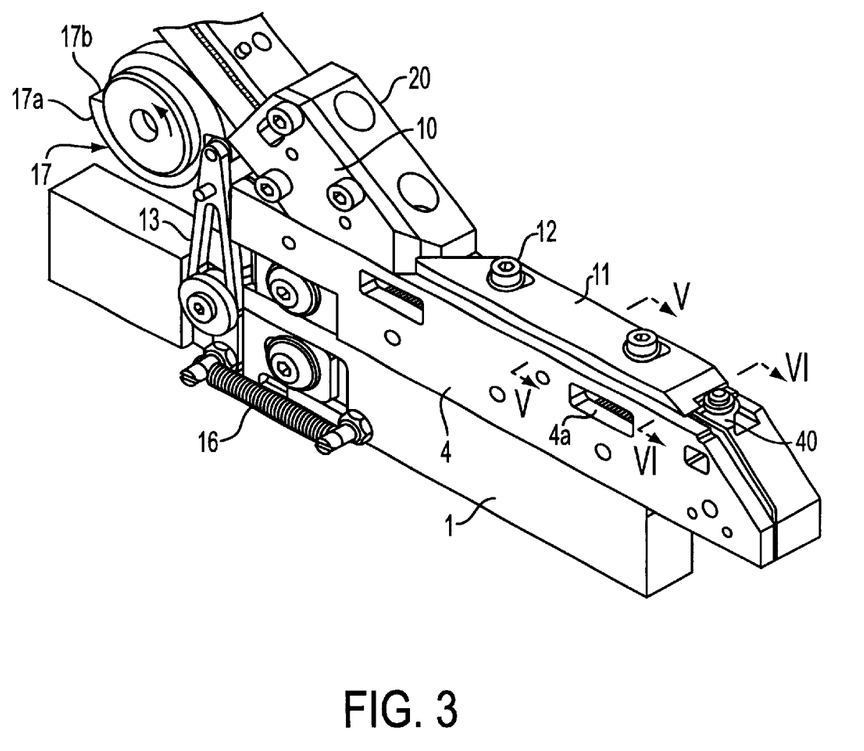
FIG. 3 is a perspective view of a first embodiment of the apparatus for transporting parts according to the present invention.
Figure 4:
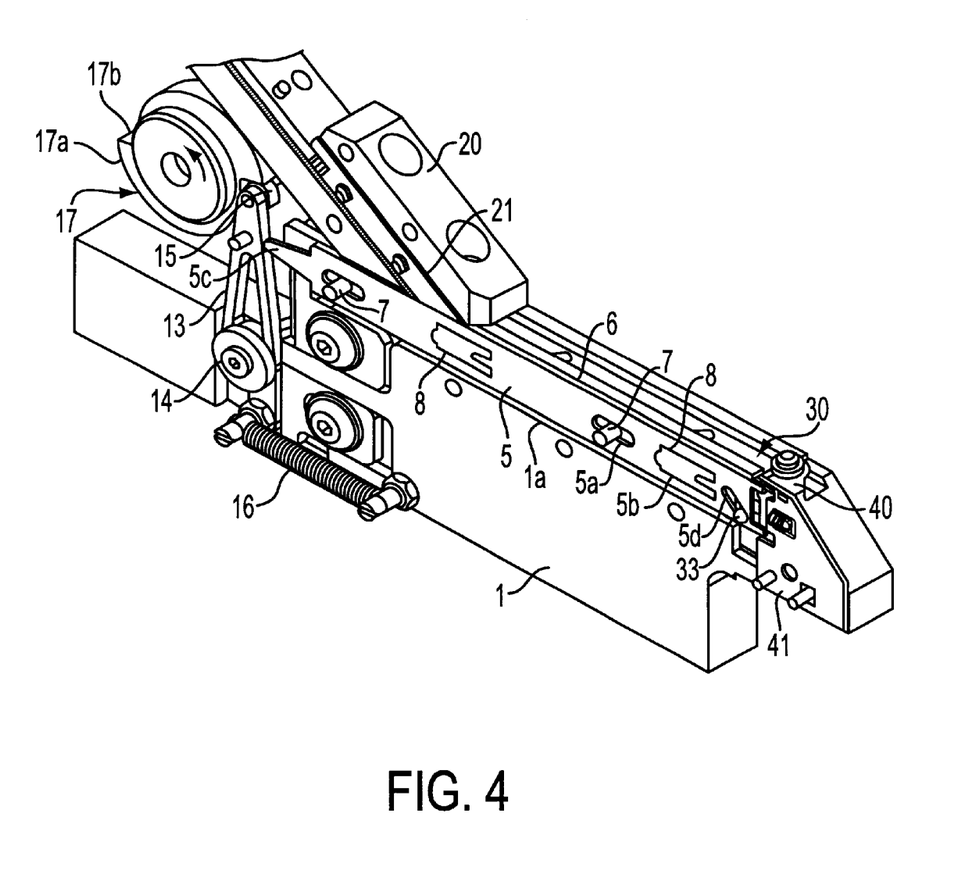
FIG. 4 is a perspective view of the apparatus for transporting parts shown in FIG. 2, with the front cover and upper cover removed.

FIG. 3 is an overall view of the apparatus, and FIG. 4 shows the state thereof with the later-described front covers 4 and 10, and the upper cover 11 removed.

Figure 5:
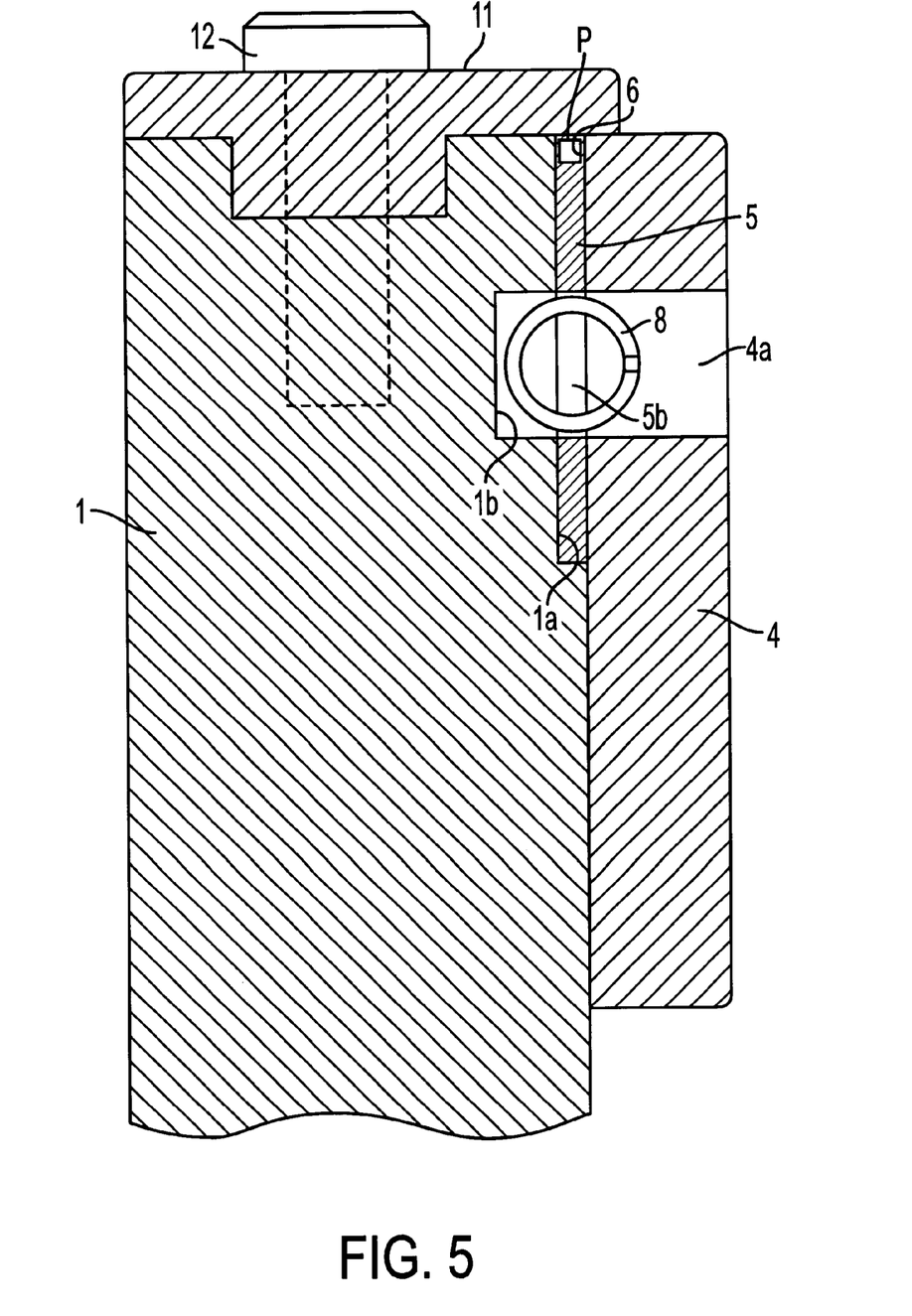
FIG. 5 is a cross-sectional diagram along line V—V in FIG. 3.

A recessed portion 1a is formed at the front of the apparatus proper 1, as shown in FIG. 5, and a narrow space is formed by fixing the front cover 4 to the front of the apparatus proper 1. A blade 5, which is an example of the transporting member, is positioned in this space so as to be slidable in the horizontal direction. A cover 11 is fixed to the upper face of the apparatus proper 1 by means of screws 12 so that the parts P do not fly out at the time of being transported. The inner face of the above recessed portion 1a, the inner face of the front cover 4, the upper plane of the blade 5, and the lower plane of the above upper cover 11, define a guiding groove 6 whereby the parts P are arrayed in one row and guided.

The blade 5 is formed of a thin metal plate, in which are formed elongated holes 5a which are elongated in the forwards/backwards direction, and spring storing holes 5b, as shown in FIG. 4. Guide pins 7 protruding from the apparatus proper 1 are inserted through the elongated holes 5a, thereby guiding the blade 5 in the forwards/backwards direction. Also, springs 8 are stored in the spring storing holes 5b, and both ends of the springs 8 in the radius direction thereof fit into a recessed portion 1b formed in the apparatus proper 1, and an opening 4a formed in the cover 4 (see FIG. 5). The back side of the spring 8 is supported by the spring storing hole 5b, and the front side thereof is supported by the recessed portion 1b and the opening 4a, so that the springs 8 constantly press the blade 5 in the backwards direction.

The back end portion 5c of the blade 5 comes into contact with the front face of an intermediate lever 13 that is attached to the apparatus proper 1 in a rockable manner, by the force of the springs 8. The center portion of the intermediate lever 13 is rockably supported by a bolt 14, a roller 15 which rotates against the perimeter of a cam 17 is attached to the upper end thereof. A spring 16 has one end attached to the apparatus proper 1, and the other end thereof is attached to the lower end of the intermediate lever 13. Accordingly, the intermediate lever 13 is pressed in a direction such that the roller 15 at the upper end thereof comes into contact with the perimeter of the cam 17. The above springs 8, intermediate lever 13, and cam 17 comprise the driving means for reciprocally driving the blade 5.

As shown in FIGS. 3 and 4, the cam 17 has a raised portion 17a and a lowered portion 17b, and is rotated in the direction indicated by the arrow at a constant speed, by mean of a motor not shown in the drawings. Owing to such an arrangement, the blade 5 advances at a slow speed in accordance with the roller 15 of the intermediate lever 13 riding up on the raised portion 17a of the cam 17, and the blade 5 rapidly retreats in accordance with the roller 15 dropping into the lowered portion 17b of the cam 17. The speed at which the above blade 5 advances depends on the inclination of the raised portion 17a of the cam 17 and the speed of rotation of the cam 17, and is set to a speed such that a certain holding resistance acts between the blade 5 and the parts P on the upper plane thereof. Also, the speed at which the above blade 5 retreats is set to a speed such that the resistance between the blade 5 and the parts P on the upper plane thereof is essentially broken. In this way, the blade 5 is advanced at a slow speed so that friction acts, and is retracted at a fast speed so that friction is broken, so that the parts P can be transported in one direction without providing any particular mechanism for preventing the parts P from moving backwards.

An arraying device 20 for arraying the parts P in single file is provided to the upper side of the rear of the apparatus proper 1, this being fixed in a diagonal manner. A chute groove 21 is formed in the arraying device 20 so that the parts P follow the inclination thereof and slide down, with a front cover 10 covering the front side of this chute groove 21. The bottom end of this chute groove 21 is connected with the end portion of the guiding groove 6, so that the parts P which have slid down the chute 21 enter into the guiding groove 6. At this time, there is a change in angle between the chute 21 and the guiding groove 6, thereby serving to prevent parts P within the guiding groove 6 from returning, by means of the part P at the bottom of the chute groove 21.

A separating groove 30 for separating the first part in the row of parts being transported from the second part therein is provided at the front end of the guiding groove 6. As shown in FIGS. 6A through 8, the separating groove 30 has a second stopper 31 for holding the second part $P_2$ in the row of parts P being transported along the surface of the blade 5, and synchronizing means 32 for rocking (opening/closing) the stopper in a manner synchronous with the forwards/backwards motion of the blade 5. The bottom end 31a of the second stopper 31 is supported by a recessed portion 1c formed in the apparatus proper 1 with an arc-shaped cross-section, and the second stopper 31 is free to rock in the width friction of the guiding groove 6. The synchronizing means 32 in the present embodiment is provided to the tip of the blade 5, and is comprised of a first groove 5d inclined diagonally in the forwards/backwards direction, a second groove 4b formed vertically to the inner side of the front cover 4 for guiding the side of the blade 5, a ball 33 inserted so as to straddle the first groove 5d and the second groove 4b, an inclined plane 31b formed in the side of the second stopper 31 in the longitudinal direction which comes into contact with the ball 33, and a spring 34 which presses the second stopper 31 in the direction of holding a part.

Figure 6A:
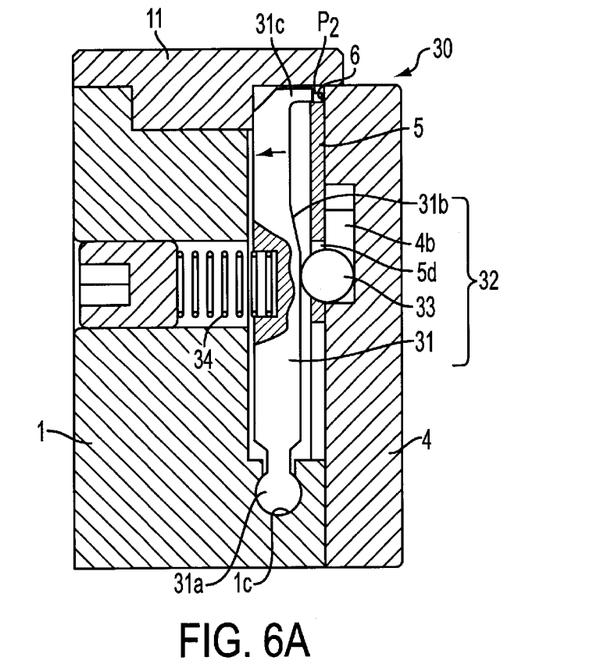
FIG. 6A is a cross-sectional diagram along line VI—VI in FIG. 3, with a part released.

When the blade 5 is at the retracted position, the ball 33 is at the lower end of the first groove 5d and second groove 4b, as shown in FIG. 6A. Accordingly, the ball 33 is situated at a position lower than the inclined plane 31b of the second stopper 31, pressing the second stopper 31 in the direction of opening. Accordingly, the part $P_2$ within the guiding groove 6 is not held.

Figure 6B:
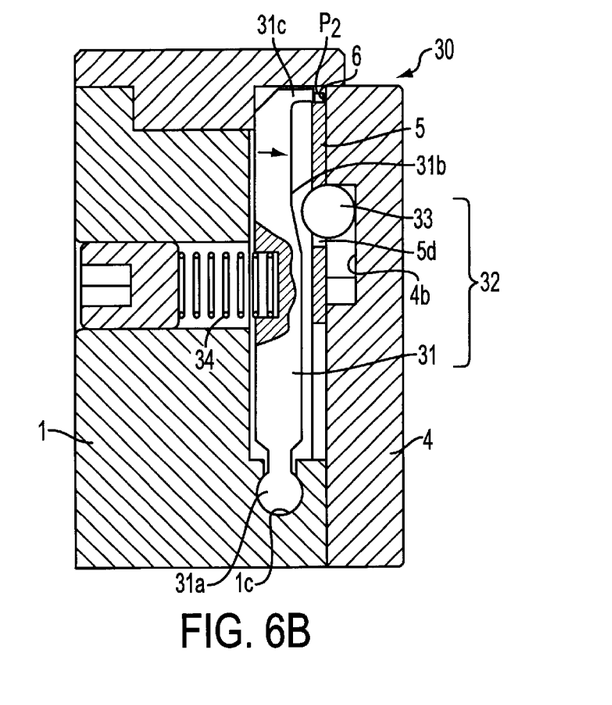
FIG. 6B is a cross-sectional diagram along line VI—VI in FIG. 3, with a part held.
Figure 7:
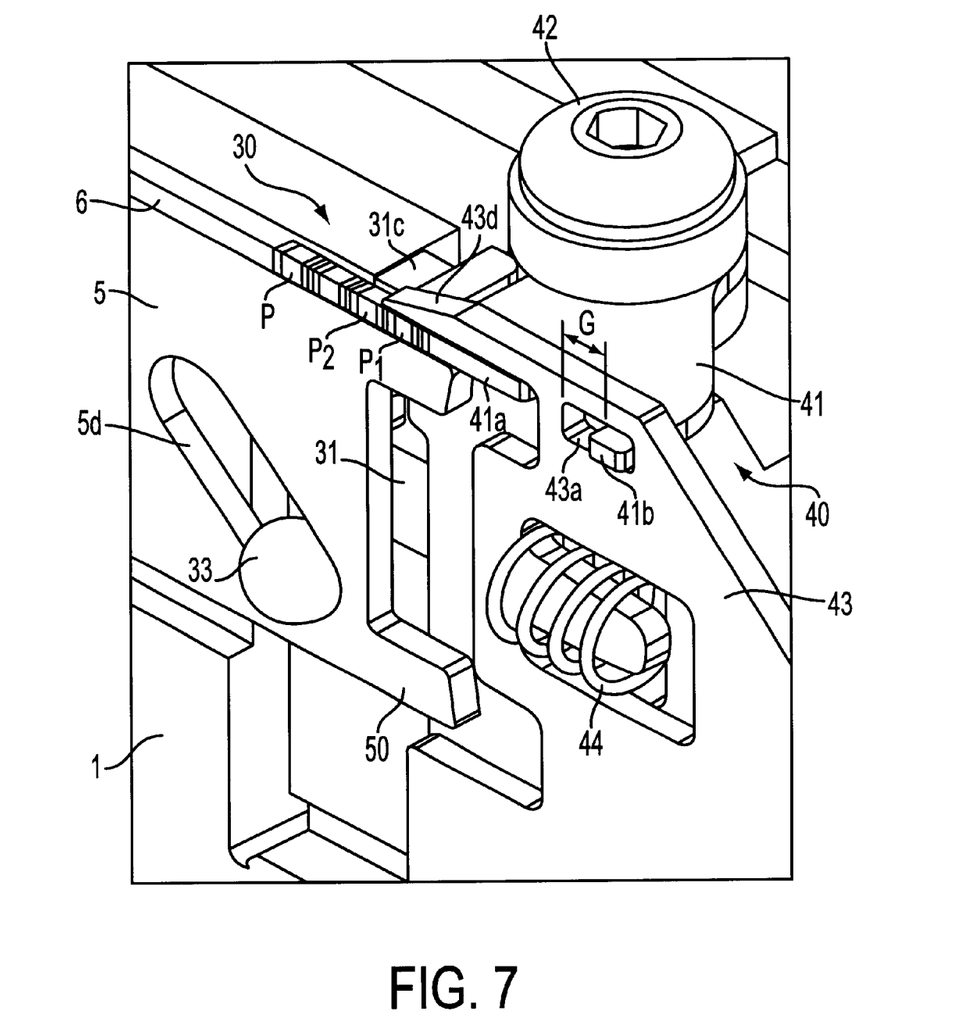
FIG. 7 is an enlarged perspective view of an escape mechanism, before separating.
Figure 8:
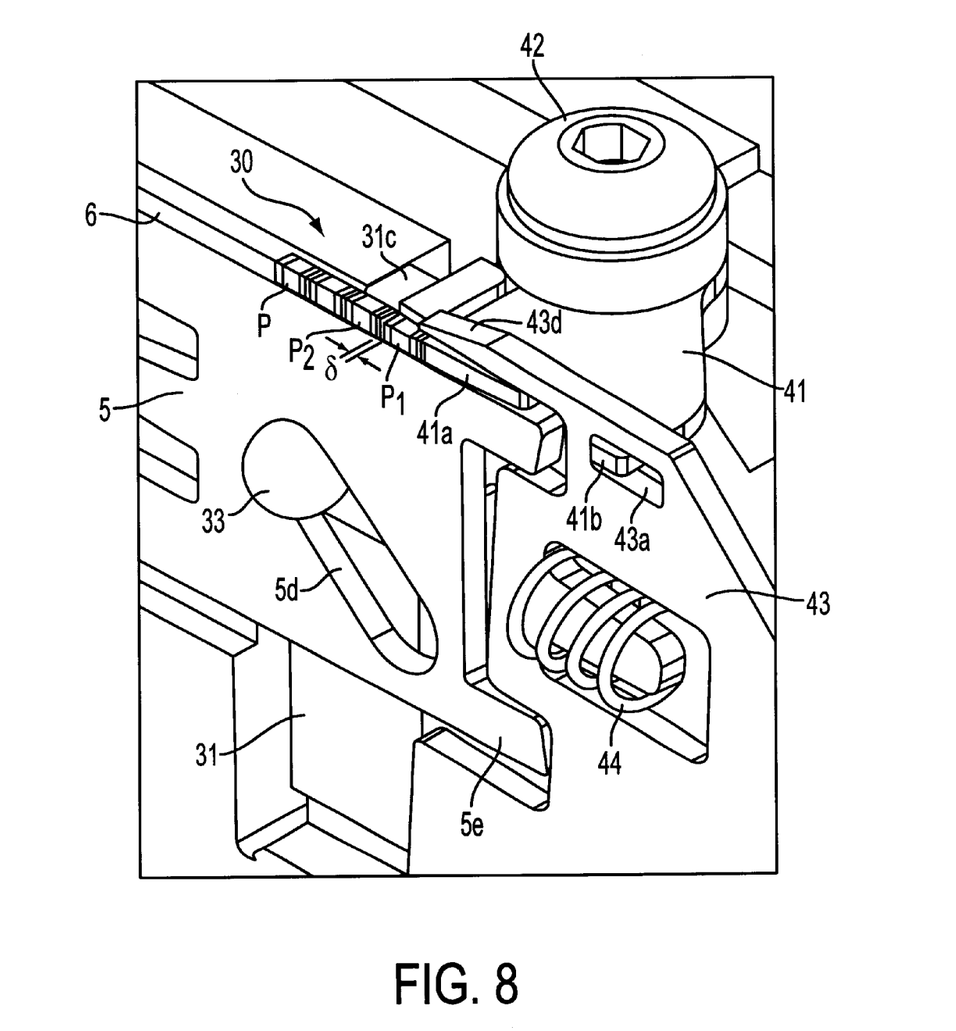
FIG. 8 is an enlarged perspective view of the escape mechanism, after separating.

When the blade moves forward, the difference in angle between the first groove 5d and second groove 4b causes the ball to move upwards as shown in FIG. 6B, so that the ball 33 corresponds with the inclined surface 31b of the second stopper 31. Accordingly, the force of pressing the second stopper 31 open is disengaged, the second stopper 31 rocks in the direction of closing by means of the spring 34, thereby the part $P_2$ is held between the tip portion 31c of the second stopper 31 and the inner face of the guiding groove 6.

Further, when the blade 5 retreats, the difference in angle between the first groove 5d and second groove 4b causes the ball 33 to move downwards, the ball rides up on the inclined plane 31b of the second stopper 31, thereby pressing open the second stopper 31. Accordingly, the part $P_2$ within the guiding groove 6 can move freely.

As shown in FIGS. 7 to 9C, provided to the tip portion of the guiding groove 6 is: an escape mechanism 40 which maintains the stopping position of the first part $P_1$ constant at the time that the first part $P_1$ and the second part $P_2$ are separated, and which presses the first part $P_1$ back so as to secure a gap δ between the first part $P_1$ and the second part $P_2$ in the event that an error occurs in extracting the first part $P_1$ for some reason.

The escape mechanism 40 corresponds to a certain arrangement of the present invention, and comprises a first stopper 41 rotatably provided to the tip of the guiding groove 6 with a shaft 42 as the center of rotation thereof, and a synchronizing member 43 which rotates the first stopper forwards synchronously with the blade 5 immediately before the blade 5 completes its forward movement. The first stopper 41 is provided with rotational resistance by means of a resistance member not shown in the drawing. The first stopper 41 has a first protrusion 41a for stopping the first part, and a second protrusion 41b. The synchronizing member 43 also serves as a shutter for keeping a certain gap G between the blade 5 and the first stopper 41 so as to synchronize the two. This gap G is provided by the gap between a hole 43a in the shutter 43 and the second protrusion 41b. The shutter 43 can be rocked forwards or backwards on the rotating shaft 43b (see FIG. 9A), and is pressed backwards by a spring 44 (in the direction corresponding with the blade 5). Incidentally, as shown in FIG. 4, a pin 45 protruding from the apparatus proper 1 is inserted into the hole 43c in the shutter 43, thereby restricting the rocking angle of the shutter 43. Integrally provided on the top of the shutter 43 is a cover 43d which covers the upper side of the first part $P_1$, so as to keep the space above the first part $P_1$ closed off until immediately before extracting the first part $P_1$ from the guiding shaft 6, thereby preventing the first part $P_1$ from flying out.

Now, the operation of the above escape mechanism 40 will be described with reference to FIGS. 9A through 9C.

Figure 9A:
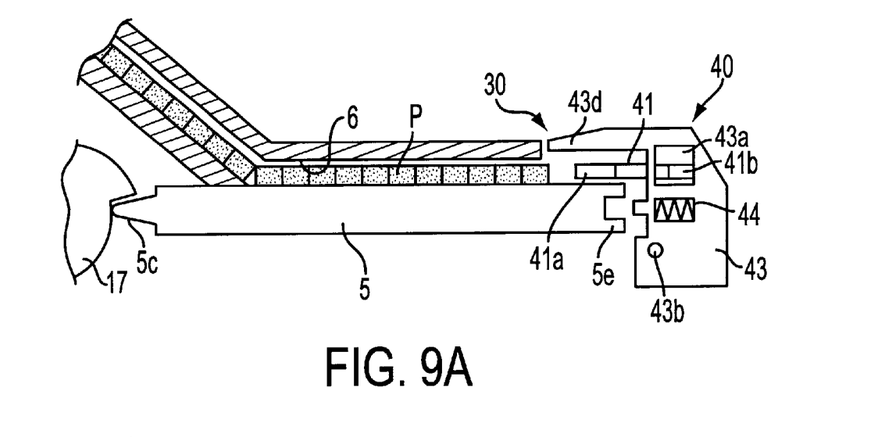
FIGS. 9A through 9C are explanatory diagrams illustrating the operation of the escape mechanism.

FIG. 9A is an initial state, from which the blade 5 moves forward at low speed by the cam 17, and the parts P on the blade 5 also advance.

Figure 9B:
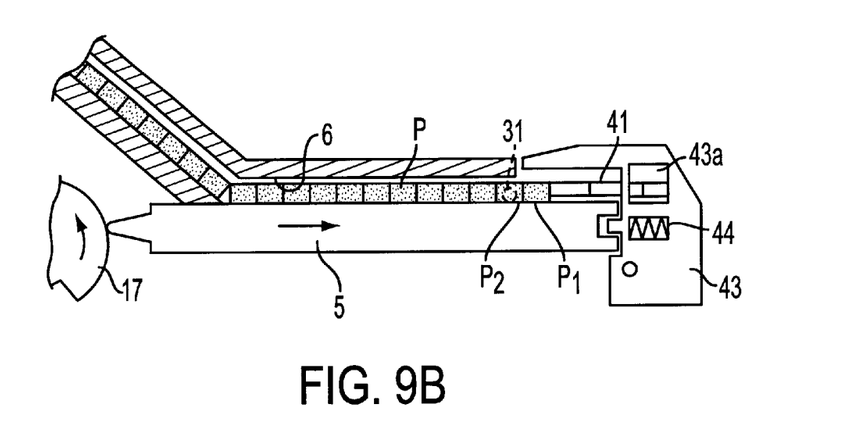

FIG. 9B shows a state wherein the tip of the blade 5 neighbors the shutter 43, and the first part $P_1$ is in contact with the rear plane of the first protrusion 41a of the first stopper 41. In this state, the second part $P_2$ is pressed against the inner plane of the guiding groove 6 by the second stopper 31 and thus held.

When the blade 5 further advances from the state shown in FIG. 9B, the first part $P_1$ advances along with the blade 5 while still in contact with the rear side of the first protrusion 41a of the first stopper 41, since the second part $P_2$ is held by the second stopper 31, and thus the part $P_1$ is separated from the second part $P_2$. The tip 5e of the blade 5 presses the shutter 43, so the shutter 43 also rotates forwards along with the progression of the blade 5, but the first stopper 41 does not rotate synchronously with the shutter 43, and begins rotating after being delayed by an amount equivalent to the gap G.

Figure 9C:
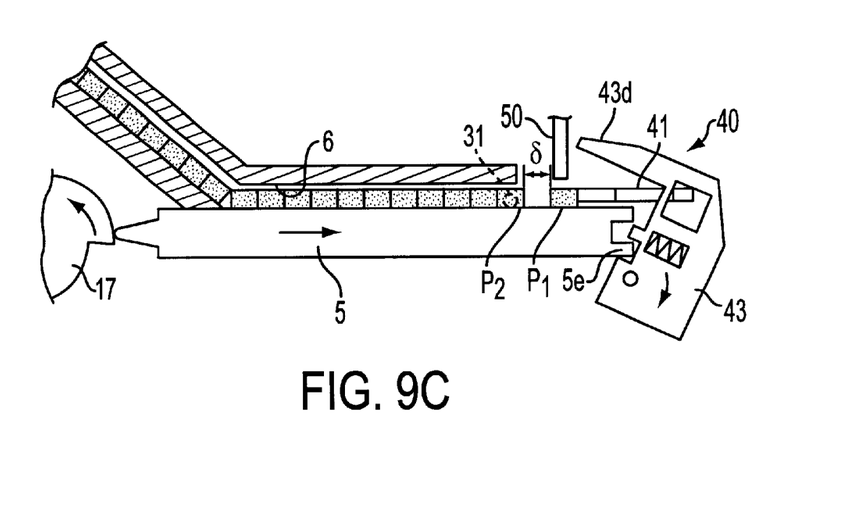

FIG. 9C shows the state of the blade 5 having reached the fore-most position. The point of contact of the shutter 43 and tip 5e of the blade 5 is close to the rotating shaft 43b, so the speed of the cover 43d of the shutter 43 is faster than that of the blade 5, and the cover 43d of the shutter 43 is designed to open immediately prior to the blade 5 reaching the fore-most position. In this way, the first part $P_1$ is separated from the second part $P_2$ and held at a certain position in contact with the rear side of the first stopper 41, with the cover being open, so the first part $P_1$ can easily be extracted by an extracting device 50 such as a mounter.

Incidentally, in the event that there has been an extracting failure by the extracting device 50, the first part $P_1$ is pressed back to the position of the second part $P_2$ by the first stopper 41, so that separation can be repeated.

Figure 10A:
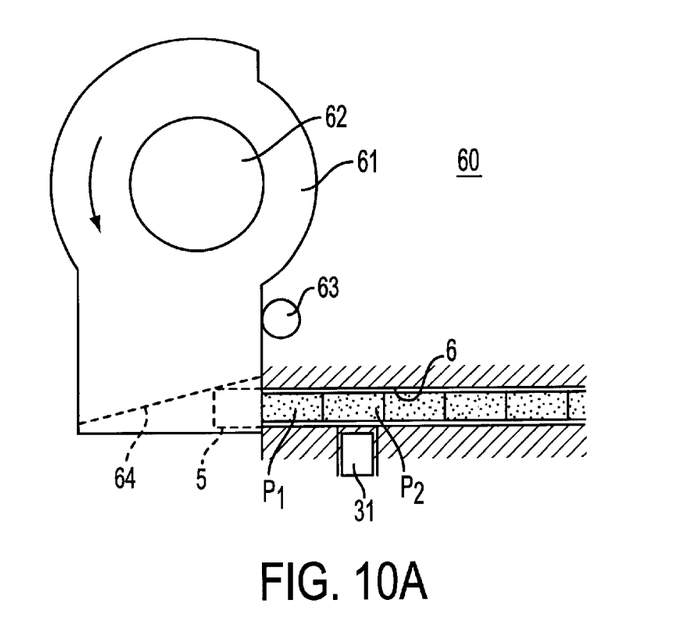
FIGS. 10A and 10B are plan views illustrating another embodiment of the escape mechanism.
Figure 10B:
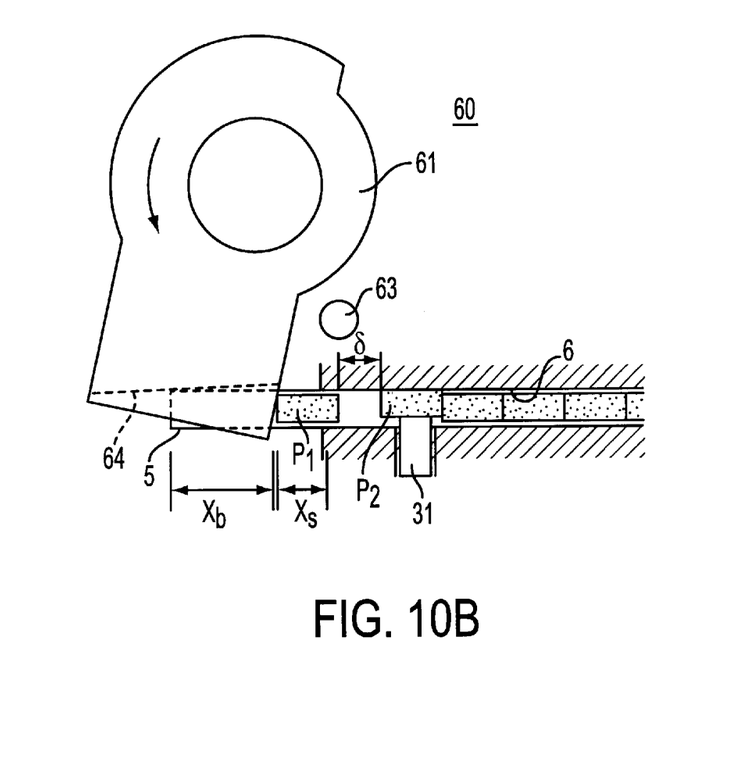

FIGS. 10A and 10B illustrate another example of the escape mechanism 60, this escape mechanism 60 corresponding to a certain arrangement of the present invention.

The escape mechanism 60 comprises a first stopper 61 rotatably provided to the tip of the guiding groove 6 with a shaft 62 as the center of rotation thereof, and the first stopper 61 is rotatably pressed in the direction of the arrow in the Figure by means of a torsion spring (not shown). Also, reference numeral 63 denotes a pin restricting the stopping position of the first stopper 61. An inclined plane 64 is provided to the lower plane of the first stopper 61, and the tip of the blade 5 is capable of coming into contact with this inclined plane 64.

In the initial state, the tip of the blade 5 is in contact with the rear side of the inclined plane 64, as shown in FIG. 10A, and the part P on the blade 5 has come into contact with the rear plane 61a of the first stopper 61 and is stopped. In this state, the second stopper 31 is operated, and the second part $P_2$ is pressed against the inner plane of the guiding groove 6.

Next, the blade 5 advances, the inclined plane 64 is pressed forward, and the first stopper 61 follows in rotating in the direction opposite to that indicated by the arrow. At this time, there is an inclination between the direction of advance of the blade 5 and the inclined plane 64, so the progressing speed of the rear side 61a of the first stopper 61 is smaller than the forward speed of the blade 5, and accordingly, the amount of forward progress Xs of the rear plane 61a of the first stopper 61 is smaller than the amount of forward progress Xb of the blade 5. That is to say, the first part $P_1$ progresses while remaining in contact with the rear plane 61a of the first stopper 61.

FIG. 10B shows the state of the blade 5 having reached the fore-most position. In this state, a gap δ is formed between the first part $P_1$ and the second part $P_2$, so the first part $P_1$ can easily be extracted by a mounter or the like.

Even in the event that there has been an extracting failure, the first part $P_1$ is pressed back to the position shown in FIG. 10A by the rear side 61a of the first stopper 61, so that the first part $P_1$ and the second part $P_2$ can be separated.

Though description has not been made in FIGS. 10A and 10B regarding a shutter, it is needless to say that a shutter operating synchronously with the movement of the blade 5 may be provided for this embodiment, as well. It should be noted though, that the embodiment shown in FIGS. 9A through 9C involve the first stopper 41 being operated by the shutter 43, but with the embodiment shown in FIGS. 10A and 10B, first stopper 41 is operated independent of the shutter 61.

It should be noted that the present invention is by no means restricted to the above embodiments.

The driving means for reciprocally driving the transporting member (blade 5) is not restricted to a combination of springs 8, an intermediate lever 13, and cam 17, as shown in FIG. 4; rather, the intermediate lever 13 may be omitted so that the rear end of the blade 5 comes into direct contact with the perimeter of the cam 17. Also, a rack-and-pinion mechanism may be used instead of the cam, or other various types of mechanisms may be used. The driving source is not restricted to a rotational motion mechanism such as a motor, but may rather be a linear motion mechanism instead.

In the above embodiments, friction owing to difference in speed between the transporting member (blade) and parts was used as the method for transporting the parts in one direction, but instead, a mechanism may be provided at the rear of the guiding groove, for example, in order to prevent the parts from moving backwards. The mechanism for preventing backwards movement may employ the difference in angle between the above chute 21 and guiding groove 6, or a mechanism may be separately provided which acts to hold the parts only when the transporting member is moving backwards. In this case, the holding mechanism is released at the time of the transporting member advancing, so the parts move forwards on the transporting member, but the holding mechanism holds the sides of the parts at the time of the transporting member retracting, thereby preventing the parts from moving forwards.

Also, the means for synchronizing the forwards/backwards movement of the transporting member with the opening/closing movement of the stopper is not restricted to a combination of grooves 4b and 5d, a ball 33 and a second stopper 31 as in the above embodiments; rather, a stopper may be positioned in a horizontal direction, so as to open and close by a protrusion on the side of the transporting member coming into contact with the inclined plane of the stopper.

Also, in the above embodiments, the second part $P_2$ is held between the inner face of the guiding groove and stopper, but a pair of stoppers capable of opening and closing may be provided on either side of the guiding groove, so as to hold the second part $P_2$ between these stoppers.

Further, neither is the transporting member restricted to a blade; rather, any material capable of forming the bottom of the guiding groove and moving forwards and backwards may be used. Also, parts which can be transported by the present invention are not limited to square chips; rather, any sort of parts may be transported as long as the parts are capable of being arrayed in one row and transported through the guiding groove.

As can be clearly understood from the above description, with the apparatus for transporting parts according to the present invention, parts are transported forwards along a guiding groove by a reciprocally driven transporting member, and a second stopper holds the second part in the row, following which the transporting member is further move forwards, whereby the first part in the row and the second part are separated. Accordingly, even non-magnetic members can be separated in a sure manner, and the shortcomings of the known method using magnetism can be overcome. Consequently, the first part can be easily extracted from the guiding groove.

Also, a movable firs stopper is provided for stopping the first part in the row at the tip of the guiding groove, so the stopping position can be maintained constant by keeping the first part abutted against the first stopper at the time of separating the first part from the second part, thereby facilitating ease of extracting. Even in the event that an extracting failure leaves the first part remaining on the transporting member, the first part is pressed back by the first stopper to a position at which it is in contact with the second part, so that the separation/extraction can be attempted any number of times. Accordingly, even in the event that an extracting failure occurs, supply can be continued without stopping the overall apparatus.

What is claimed is:

1. A part transporting apparatus, comprising:
   a guiding groove for lining up parts in one row and guiding said parts;
   a transporting member which is provided at the base of said guiding groove and transports parts in one direction by moving forwards and backwards along said groove;

a driving means for reciprocally driving said transporting member in the forward and backward directions;

a first stopper which is provided at the tip of said guiding groove to stop the first part in the row;

a second stopper which operates so as to open and close in the width direction of said guiding groove, and hold the second part from the front of the row of parts being transported on the upper plane of said transporting member;

a synchronizing means for opening and closing said second stopper synchronously with the reciprocal forward and backward movement of said transporting member; and a synchronizing mechanism for moving said first stopper forwards synchronously with said transporting member immediately before completion of the forward movement of said transporting member, and for moving said first stopper backwards following the backward movement of said transporting member;

wherein, once the second stopper holds the second part, the transporting member moves forward by a certain distance, thereby separating the first part in the row and the second part.

2. A part transporting apparatus according to claim 1, further comprising extracting means for extracting from said guiding groove said first part which has been separated from said second part.

3. A part transporting apparatus according to claim 1, said synchronizing mechanism comprising:

a resistance member which holds said first stopper by friction resistance; and a synchronizing member which opens a certain gap between said first stopper and said transporting mechanism so as to cause synchronous operation;

wherein said first stopper is pressed by said transporting member so as to move forwards at the time of said transporting member moving forwards by a certain distance following said second stopper holding the second part, said first stopper retreats by means of said synchronizing member in a manner following the backward movement of said transporting member;

and wherein, in the event that the first part in the row remains on said transporting member, the first part is pressed backwards by said first stopper so as to come into contact with the second part in the row.

4. A part transporting apparatus according to claim 1, said synchronizing mechanism comprising:

a spring which presses said first stopper backwards; and a restricting member which restricts the backwards movement of said first stopper;

wherein said first stopper is pressed by said transporting member so as to move forwards at the time of said transporting member moving forwards by a certain distance following said second stopper holding the second part, said first stopper retreats by means of said spring in a manner following the retreat of said transporting member;

and wherein, in the event that the first part in the row remains on said transporting member, the first part is pressed backwards by said first stopper so as to come into contact with the second part in the row.

5. A part transporting apparatus according to claim 1, wherein said driving means drives said transporting member in a reciprocal manner such that the speed of moving in the backward direction is greater than the speed of moving in the forward direction;

wherein the speed of moving in the forward direction is a speed at which holding friction acts between said transporting member and a part disposed upon the upper surface thereof;

and wherein the speed of moving in the backward direction is a speed at which the friction between said transporting member and a part disposed upon the upper surface thereof is essentially broken.

6. A part transporting apparatus according to claim 2, said synchronizing mechanism comprising:

a resistance member which holds said first stopper by friction resistance; and a synchronizing member which opens a certain gap between said first stopper and said transporting mechanism so as to cause synchronous operation;

wherein said first stopper is pressed by said transporting member so as to move forwards at the time of said transporting member moving forwards by a certain distance following said second stopper holding the second part, said first stopper retreats by means of said synchronizing member in a manner following the backward movement of said transporting member;

and wherein, in the event that the first part in the row remains on said transporting member, the first part is pressed backwards by said first stopper so as to come into contact with the second part in the row.

7. A part transporting apparatus according to claim 2, said synchronizing mechanism comprising:

a spring which presses said first stopper backwards; and a restricting member which restricts the backwards movement of said first stopper;

wherein said first stopper is pressed by said transporting member so as to move forwards at the time of said transporting member moving forwards by a certain distance following said second stopper holding the second part, said first stopper retreats by means of said spring in a manner following the retreat of said transporting member;

and wherein, in the event that the first part in the row remains on said transporting member, the first part is pressed backwards by said first stopper so as to come into contact with the second part in the row.

8. A part transporting apparatus according to claim 2, wherein said driving means drives said transporting member in a reciprocal manner such that the speed of moving in the backward direction is greater than the speed of moving in the forward direction;

wherein the speed of moving in the forward direction is a speed at which holding friction acts between said transporting member and a part disposed upon the upper surface thereof;

and wherein the speed of moving in the backward direction is a speed at which the friction between said transporting member and a part disposed upon the upper surface thereof is essentially broken.

9. A part transporting apparatus according to claim 3, wherein said driving means drives said transporting member in a reciprocal manner such that the speed of moving in the backward direction is greater than the speed of moving in the forward direction;

wherein the speed of moving in the forward direction is a speed at which holding friction acts between said transporting member and a part disposed upon the upper surface thereof;

and wherein the speed of moving in the backward direction is a speed at which the friction between said transporting member and a part disposed upon the upper surface thereof is essentially broken.

10. A part transporting apparatus according to claim 4, wherein said driving means drives said transporting member in a reciprocal manner such that the speed of moving in the backward direction is greater than the speed of moving in the forward direction;

wherein the speed of moving in the forward direction is a speed at which holding friction acts between said transporting member and a part disposed upon the upper surface thereof;

and wherein the speed of moving in the backward direction is a speed at which the friction between said transporting member and a part disposed upon the upper surface thereof is essentially broken.

* * * * *